United States Patent [19]
Mattison et al.

[11] Patent Number: 5,179,295
[45] Date of Patent: Jan. 12, 1993

[54] DUAL EDGE-TRIGGERED DIGITAL STORAGE ELEMENT AND METHOD THEREFOR

[75] Inventors: Phillip E. Mattison, Gilbert; Kenneth P. Caviasca, Phoenix, both of Ariz.

[73] Assignee: VLSI Technology, Inc., San Jose, Calif.

[21] Appl. No.: 854,154

[22] Filed: Mar. 20, 1992

[51] Int. Cl.$^5$ ............................................. H03K 3/356
[52] U.S. Cl. .................................... 307/289; 307/279; 307/481; 307/269
[58] Field of Search ............... 307/269, 289, 473, 242; 365/154, 156, 185, 188

[56] References Cited

U.S. PATENT DOCUMENTS

| | | | |
|---|---|---|---|
| 4,066,919 | 1/1978 | Huntington | 307/353 |
| 4,607,173 | 8/1986 | Knoedl, Jr. | 307/289 |
| 4,629,909 | 12/1986 | Cameron | 307/291 |
| 4,756,006 | 7/1988 | Rickard | 307/241 |
| 4,873,456 | 10/1989 | Olisar et al. | 365/154 |

Primary Examiner—William L. Sikes
Assistant Examiner—Sinh Tran
Attorney, Agent, or Firm—Harry M. Weiss

[57] ABSTRACT

A dual edge-triggered digital storage element is disclosed. This storage element operates much like a standard digital latch, with the exception that the data input is clocked to the output on both the rising and the falling edge of the clock input. This allows the frequency of the clock signal to be reduced by half, reducing system complexity and reducing power consumption.

1 Claim, 2 Drawing Sheets

DUAL EDGE-TRIGGERED DIGITAL STORAGE ELEMENT AND METHOD THEREFOR

FIELD OF THE INVENTION

This invention generally relates to electronic circuits and methods, and, more specifically, relates to a dual edge-triggered digital storage element and method therefor which stores the input data on both the positive edge and the negative edge of the clock input, and has an output for this stored data.

DESCRIPTION OF THE PRIOR ART

The prior art provided various types of digital storage elements for storing input data sampled on one edge of a reference clock signal. One common element was a transparent latch. The typical transparent latch had a data input, a data output, and a clock input. The data output of the transparent latch follows or tracks the data input (transparent mode) when the clock is in one state. When the clock changes state, the data present on the data input is stored (latched mode), and appears on the data output until the clock changes state again, at which time the data output resumes tracking the data input.

Transparent latches can be either negative edge-triggered or positive edge-triggered A negative edge-triggered transparent latch is transparent when the clock signal is high, and latches the input data when the clock makes the high-to-low transition (negative edge). A positive edge-triggered transparent latch is transparent when the clock signal is low, and latches the input data when the clock makes the low-to-high transition (positive edge).

Standard latches that do not have the transparent mode described above were also common. These latches store the data input on a certain clock edge, and output that data until the same type of clock edge stores data on the next cycle of the clock input.

As described above, both the transparent and standard latches of the prior art store the input data only on one transition of the clock. The clock signal must therefore undergo one full period before latching the data again. In synchronous applications it is desirable to store data on both the high and the low transitions of the clock.

Therefore, there existed a need to provide a dual edge-triggered digital storage element which stores the input data on both transitions of the clock and provides an output for the stored data.

SUMMARY OF THE INVENTION

It is an object of this invention to provide a digital storage element and method therefor that can store the input data on both the positive and the negative transitions of the clock input, and provide this data on an output.

According to the present invention, a digital storage element is provided. This element is comprised of one positive edge-triggered transparent latch, and one negative edge-triggered transparent latch, the outputs of which are connected to three-state output buffers with enable inputs both connected to the clock signal. The three-state output buffer of the positive edge-triggered transparent latch actively drives its output when the clock signal is high, and is in a high-impedance state when the clock signal is low. The three-state output buffer of the negative edge-triggered transparent latch actively drives its output when the clock signal is low, and is in a high-impedance state when the clock signal is high. In this manner the output of the digital storage element is always actively driven by one of the two three-state output buffers. This configuration stores the data input at each clock edge, and provides an output which is synchronized to the input clock. With this type of digital storage element, the clock speed required to latch the data can be cut in half when compared to prior art methods. This reduced clock speed results in simpler system design and reduced system power consumption in systems such as CMOS logic systems where power consumption is proportional to the frequency of input signals.

The foregoing and other objects, features and advantages will be apparent from the following description of the preferred embodiment of the invention as illustrated in the accompanying drawings.

DESCRIPTION OF THE PREFERRED EMBODIMENT

Figure 1:
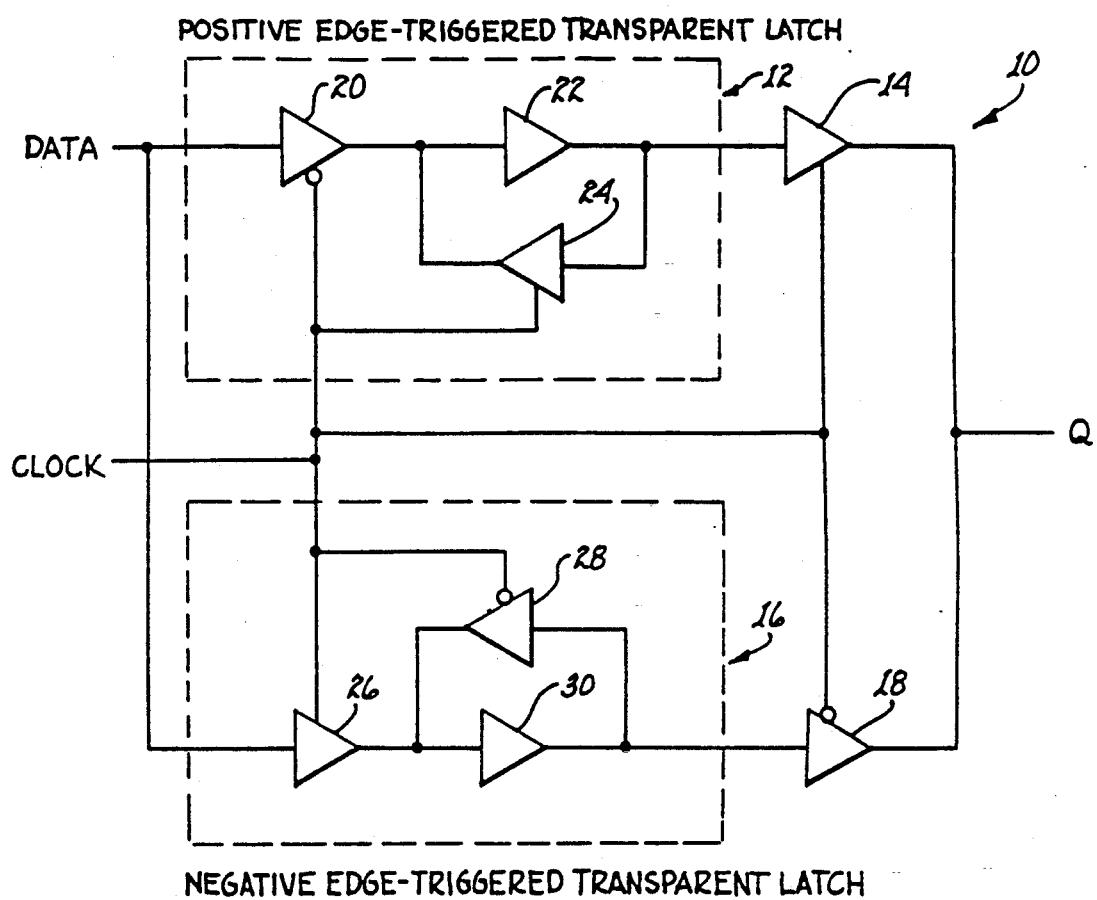
FIG. 1 is a schematic diagram of the digital storage element of the present invention.

The configuration of the digital storage element of the present invention can be best understood by referring to FIG. 1. The digital storage element 10 has a data input (DATA), a clock input (CLOCK), and a data output (Q). The storage element 10 is comprised of a positive edge-triggered transparent latch 12 with its output connected to a three-state output buffer 14, and a negative edge-triggered transparent latch 16 with its output connected to a three-state output buffer 18. The latches 12 and 16 and the output buffers 14 and 18 are all controlled by the CLOCK input. Note that output buffer 14 is enabled when CLOCK is high, while three-state buffer 18 is enabled when CLOCK is low. In this manner the three-state buffers 14 and 18 take turns driving output Q, and cannot be enabled at the same time.

Positive edge-triggered transparent latch 12 is comprised of three buffers 20, 22, and 24 as shown. When CLOCK is low, buffer 20 is enabled, buffer 24 is disabled, and the output of buffer 22 tracks the DATA input signal (transparent mode). With latch 12 in transparent mode, output buffer 14 is disabled. When CLOCK goes high, buffer 20 is disabled and buffer 24 is enabled, which maintains the output of buffer 22 in the same state (latched mode) until CLOCK goes low again. With latch 12 in latched mode, output buffer 14 is enabled and actively drives output Q.

Negative edge-triggered transparent latch 16 is likewise comprised of three buffers 26, 28, and 30 as shown. When CLOCK is high, buffer 26 is enabled, buffer 28 is disabled, and the output of buffer 30 tracks the DATA input signal (transparent mode). With latch 16 in transparent mode, output buffer 18 is disabled. When CLOCK goes low, buffer 26 is disabled and buffer 28 is enabled, which maintains the output of buffer 30 in the same state (latched mode) until CLOCK goes high again. With latch 16 in latched mode, output buffer 18 is enabled and actively drives output Q.

Output buffers 14 and 18 are enabled on opposite levels of the CLOCK input. With this configuration the data stored on the positive edge-triggered transparent latch 12 is driven to the output Q when CLOCK is high, and the data stored on the negative edge-triggered transparent latch 16 is driven to the output Q when CLOCK is low. In this manner the DATA input is latched on both the positive and negative transitions of the CLOCK input.

OPERATION

Figure 2:
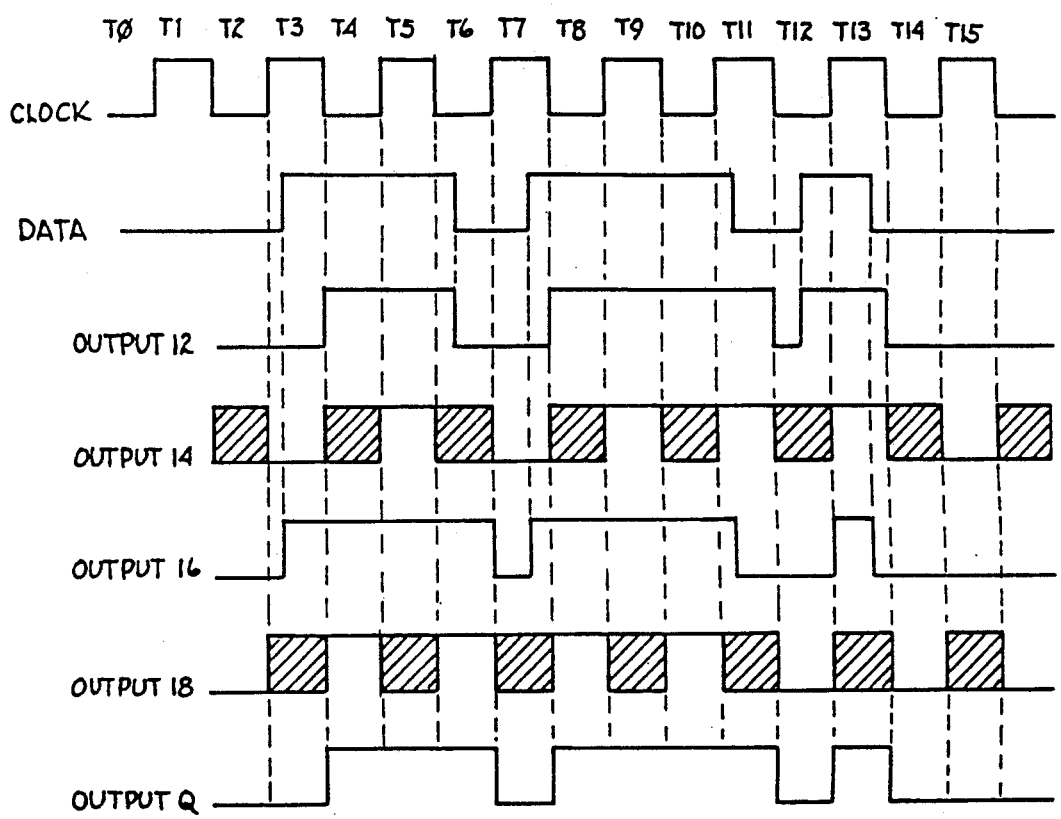
FIG. 2 is a timing diagram showing the function of the digital storage element of FIG. 1.

Waveforms for the circuit of FIG. 1 are shown in FIG. 2 to demonstrate the operation of the digital storage element 10 of the present invention. The waveforms shown correspond to the labels of FIG. 1. CLOCK, DATA, and Q are shown, along with the outputs of latches 12 and 16 and buffers 14 and 18. Note that buffers 14 and 18 are enabled by opposite levels of the CLOCK. The hashed boxes shown in the waveforms for OUTPUT 14 and OUTPUT 18 represent when these buffers are disabled and in a high-impedance state.

The CLOCK input changes from a high level in T1 to a low level in T2. This transition causes latch 12, which was in latch mode in T1, to change to transparent mode so the OUTPUT 12 tracks the DATA input. This same transition in CLOCK from T1 to T2 causes latch 16, which was in transparent mode in T11, to latch the DATA input, which is low, to its output during T2, which is enabled by output buffer 18 to drive Q with this stored data. Then the CLOCK input changes from a low level in T2 to a high level in T3. This transition causes latch 12, which was in transparent mode in T2, to latch the DATA input, which is low, to its output during T3, which is enabled by output buffer 14 to drive Q with this stored data. This same transition in CLOCK from T2 to T3 causes latch 16, which was in the latch mode in T2, to change to transparent mode so the output 16 tracks the DATA input.

When CLOCK is low, latch 12 is in transparent mode, and ready to latch the DATA input on the next rising edge of CLOCK, while latch 16 is in latch mode, the output of which is driving output Q via output buffer 18. When CLOCK is high, latch 16 is in transparent mode, and ready to latch the DATA input on the next falling edge of CLOCK, while latch 12 is in latch mode, the output of which is driving output Q via output buffer 14. In this manner one latch is in latch mode and driving the output Q while the other is monitoring DATA, prepared to latch DATA on the next clock edge.

During the odd numbered periods, when CLOCK is high, OUTPUT 16 tracks DATA as is demonstrated in T3, T7, T11, and T13, and OUTPUT 14 drives output Q. During the even numbered periods, when CLOCK is low, OUTPUT 12 tracks DATA as is demonstrated in T6 and T12, and OUTPUT 18 drives output Q. As shown in the waveform for output Q, this digital storage element 10 has an output Q that is synchronized to the CLOCK input, and each transition in DATA is detected at output Q since DATA is latched on both edges of CLOCK.

By latching DATA on both edges of CLOCK, the frequency of CLOCK is half of what prior art systems would require. This reduction in frequency can lead to a simpler design that dissipates less power in systems such as CMOS logic systems, where power consumption is proportional to the frequency of input signals.

While the invention has been described in its preferred embodiment, it is to be understood that the words which have been used are words of description rather than limitation, and that changes may be made within the purview of the appended claims without departing from the true scope and spirit of the invention in its broader aspects. For example, the specific implementation of the transparent latches could change within the scope of the present invention.

I claim:

1. A digital storage element which stores input data on both positive and negative transitions of a clock input comprising, in combination:

a system data input for a signal of interest;

a single system clock input for synchronizing said system data input;

a positive edge-triggered transparent latch having a data input electrically coupled to said system data input, having a clock input electrically coupled to said single system clock input, and having a data output, said positive edge-triggered transparent latch comprising, in combination:

a first three-state non-inverting buffer having an input comprising said data input, having a logical low enable input coupled to said clock input, and having an output which is actively driven to the logic state of said input when said clock input is in a logical low state, said output being in a high impedance state when said clock input is in a logical high state;

a non-inserting buffer having an input electrically coupled to said output of said first three-state non-inverting buffer, and having an output comprising said data output which is actively driven to the logic state of said input; and a second three-state non-inverting buffer having an input electrically coupled to said data output, having a logical high enable input coupled to said clock input, and having an output coupled to said output of said first three-state non-inverting buffer and to said input of said non-inverting buffer which is actively driven to the logic state of said input of said second three-state non-inverting buffer when said single system clock input is in a logical high state, said output of said second three-state non-inverting buffer being in a high impedance state when said clock input is in a logical low state;

a first output buffer having a data input electrically coupled to said data output of said positive edge-triggered transparent latch, having an enable input electrically coupled to said single system clock input, and having a data output;

a negative edge-triggered transparent latch having a data input electrically coupled to said system data input, having a clock input electrically coupled to said single system clock input, and having a data output, said negative edge-triggered transparent latch comprising, in combination:

a first three-state non-inverting buffer having an input comprising said data input, having a logical high enable input coupled to said clock input, and having an output which is actively driven to the logic state of said input when said clock input is in a logical high state, said output being in a high impedance state when said clock input is in a logical low state;

a non-inverting buffer having an input electrically coupled to said output of said first three-state non-inverting buffer, and having an output comprising said data output which is actively driven to the logic state of said input; and a second three-state non-inverting buffer having an input electrically coupled to said data output, having a logical low enable input coupled to said clock input, and having an output coupled to said output of said first three-state non-inverting buffer and to said input of said non-inverting buffer which is actively driven to the logic state of said input of said second three-state non-inverting buffer when said single system clock input is in a logical low state, said output of said second three-state non-inverting buffer being in a high impedance state when said clock input is in a logical high state;

a second output buffer having a data input electrically coupled to said data output of said negative edge-triggered transparent latch, having an enable input electrically coupled to said single system clock input, and having a data output; and a system data output electrically coupled to said data output of said first output buffer, and electrically coupled to said data output of said second buffer.

* * * * *